(12) United States Patent
Brcka

(10) Patent No.: US 7,976,674 B2
(45) Date of Patent: Jul. 12, 2011

(54) EMBEDDED MULTI-INDUCTIVE LARGE AREA PLASMA SOURCE

(75) Inventor: Jozef Brcka, Loundonville, NY (US)

(73) Assignee: Tokyo Electron Limited, Tokyo (JP)

( * ) Notice: Subject to any disclaimer, the term of this patent is extended or adjusted under 35 U.S.C. 154(b) by 987 days.

(21) Appl. No.: 11/762,269

(22) Filed: Jun. 13, 2007

(65) Prior Publication Data
US 2008/0308409 A1    Dec. 18, 2008

(51) Int. Cl.
C23C 16/00 (2006.01)
H01L 21/306 (2006.01)

(52) U.S. Cl. .......... 156/345.48; 118/723 I; 118/723 AN; 315/111.51

(58) Field of Classification Search ............. 118/723 I, 118/723 IR, 723 AN; 156/345.48, 345.49; 315/111.51
See application file for complete search history.

(56) References Cited

U.S. PATENT DOCUMENTS

| | | | |
|---|---|---|---|
| 5,122,251 A | | 6/1992 | Campbell et al. |
| 5,522,934 A | | 6/1996 | Suzuki et al. |
| 5,683,548 A | * | 11/1997 | Hartig et al. ............... 438/729 |
| 6,024,826 A | * | 2/2000 | Collins et al. ............ 156/345.37 |
| 6,054,013 A | * | 4/2000 | Collins et al. ............ 156/345.27 |
| 6,143,129 A | * | 11/2000 | Savas et al. ............... 156/345.48 |
| 6,244,211 B1 | | 6/2001 | Nishikawa et al. |
| 6,578,515 B2 | * | 6/2003 | Sakamoto et al. .......... 118/723 I |
| 6,908,862 B2 | | 6/2005 | Li et al. |
| 2003/0200929 A1 | | 10/2003 | Otsuki |
| 2005/0103445 A1 | | 5/2005 | Brcka et al. |

OTHER PUBLICATIONS

U.S. Patent and Trademark Office, Office Action, from U.S. Appl. No. 11/694,354, dated Jun. 11, 2009.
U.S. Patent and Trademark Office, Final Office action, from U.S. Appl. No. 11/694,354, dated Jan. 7, 2010.
U.S. Patent and Trademark Office, Advisory Action, from U.S. Appl. No. 11/694,354, dated Mar. 25, 2010.

* cited by examiner

Primary Examiner — Luz L. Alejandro
(74) Attorney, Agent, or Firm — Wood, Herron & Evans, L.L.P.

(57) ABSTRACT

Plasma generating devices, systems and processes are provided in which hybrid capacitively coupled plasma (CCP) and inductively coupled plasma (ICP) sources use a plurality of primary plasma generating cells embedded into large area electrode or elsewhere in communication with a plasma processing chamber. Plasma is generated and maintained by a shaped low-inductance element within each of a plurality of locally enhanced ICP micro-cells coupled to the chamber through a CCP electrode. The source is suitable for processing large diameter (300 mm and larger) semiconductor wafers and large area panels, including plasma screen displays.

30 Claims, 9 Drawing Sheets

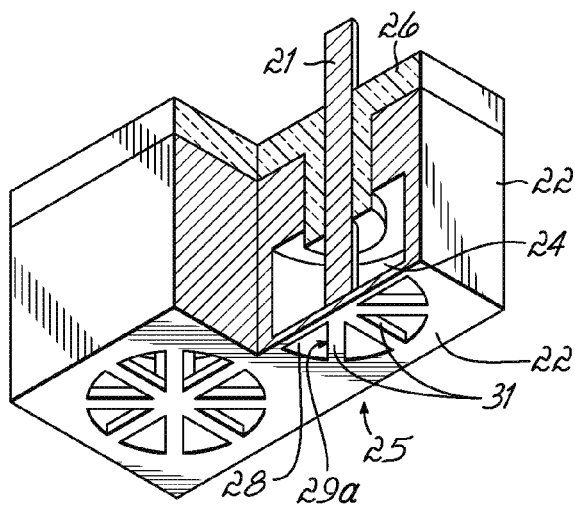
FIG. 3A
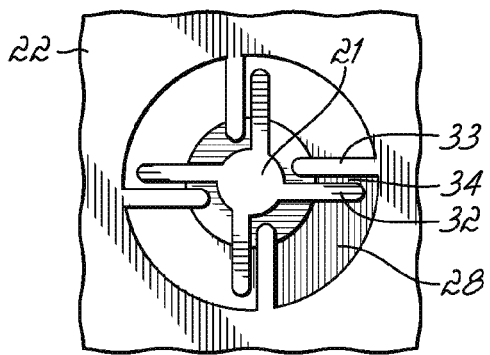
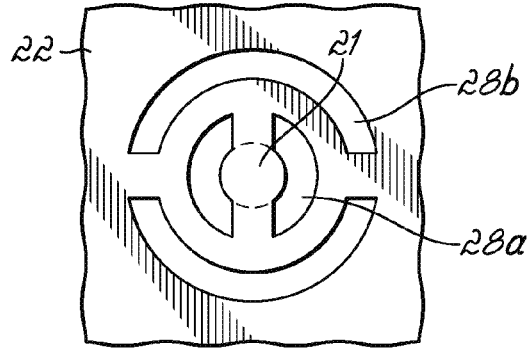
FIG. 3B  FIG. 3C
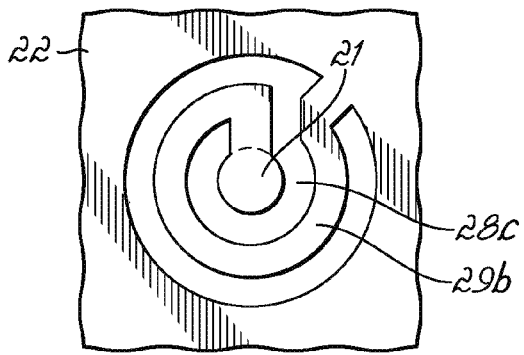
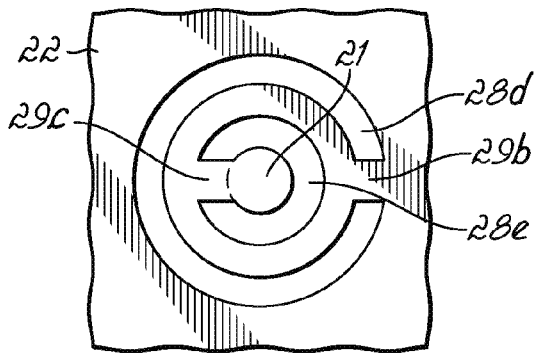
FIG. 3D  FIG. 3E

EMBEDDED MULTI-INDUCTIVE LARGE AREA PLASMA SOURCE

This application is related to commonly assigned U.S. patent application Ser. No. 11/694,354, filed Mar. 30, 2007; Ser. No. 11/563,399, filed Nov. 27, 2006, now U.S. Pat. No. 7,771,562; and Ser. No. 10/716,729, filed Nov. 19, 2003, now U.S. Pat. No. 7,426,900, by the applicant hereof, each expressly incorporated herein by reference.

FIELD OF THE INVENTION

This invention relates to the plasma and radical processing sources and reactors, and to plasma and radical processing systems.

BACKGROUND OF THE INVENTION

In plasma systems, non-uniformities have been reported in field-free plasmas, that is, in plasmas in which no magnetic field is present. For example, in systems having inductively coupled plasma (ICP) sources, such non-uniformities have been found during plasma assisted etching of large objects greater than 50 cm in length, when 13.56 MHz RF bias was applied. This non-uniformity was reduced at lower bias frequencies, but the cause has not been explained. Uniformity tolerances for integrated circuit manufacturing are becoming more stringent, while wafer size is projected to increase further. Therefore, process uniformity issues are especially important in the processing of large substrates.

Plasma sources used for the processing of semiconductor wafers and some other substrates have evolved from those using simple DC ionization sources to complex RF sources that produce high-density, low energy plasmas. The RF sources include inductively coupled plasma (ICP) sources, and capacitively coupled plasma (CCP) sources. Design of these RF plasmas has traditionally involved the design of antenna and electrode configurations of a unitary source that creates or otherwise introduces bulk plasma in a plasma volume within a processing chamber. Antenna or electrode placement and shape, as well as various chamber properties, are design parameters that are varied to shape the bulk plasma.

The most common inductively coupled plasma (ICP) sources include coils with a planar, cylindrical or dome-shaped geometry. Antennas with more complex shapes have been more recently described in patent literature, including combined, hybrid and dual-coil configurations, coils formed of multiple small solenoids, multiple spirals, multi-zone ICP enhanced PVD coils producing a torroidal plasma, coils designed as a transmission line, embedded coils, planar helicon antennas, 3D antennas, segmented antennas, parallel conductor antennas, etc.

Capacitive coupling plasma (CCP) sources are often driven by a combination of at least two frequencies to achieve independent control of the ion flux and the ion energy impacting the electrodes. This has resulted in a widening of the range of frequencies that are used. A major attraction of dual-frequency excitation is an expectation of the ability to independently control ion flux and the ion energy. Typically in dual frequency systems, a wafer supporting electrode is at lower frequency of, for example, 13.56 MHz, while a second frequency, usually higher than the wafer bias frequency, is provided to give quasi-independent control of the plasma (ion) density and, to some extent, plasma uniformity. In some circumstances, a third frequency is added to further control the etching processes by modifying the ion energy distribution function at the substrate. This multiple frequency excitation produces additional electron heating mechanisms. It has been considered that the electron heating in the sheath is greatly enhanced by the combination of two frequencies, i.e., the heating produced is much larger than the sum of the two single contributions.

With increased size of the wafer and the wafer supporting electrode, electromagnetic effects become important in capacitively coupled plasmas, and a significant amount of heating is provided by the inductive field as the discharge experiences a capacitive-to-inductive transition. Recent work on this subject has focused on two primary points: One group of studies has examined the influence of RF frequency on excitation and ionization changes that impact etch parameters, and provides guidance in the development of advanced plasma sources and processes capable of controlling the plasma and surface chemistry. Another group of studies has focused on non-uniformities introduced into the plasma by the skin effects and standing waves. This group of studies represents potential critical limitations to the practical implementation of high frequency sources for large-area processing.

High-density magnetic-field-free plasma sources produce plasmas that are opaque to radio frequency (RF) fields when using frequencies in the 2-200 MHz frequency range. At these frequencies, a skin effect occurs by which plasma currents from a biased substrate flow to ground along reactor and electrode surfaces. In an ICP source with densities of from $10^{11}$ to $10^{12}$ cm$^{-3}$ in argon, an RF skin effect has consequences. Magnetic probe measurements confirm that capacitively coupled RF fields are localized near the reactor surfaces where the skin-effect current flows. Further, RF wavelength and phase velocity along reactor surfaces have been found to be reduced by a factor of about 5 compared to the wavelength in free space. The effective RF wavelength, or wavelength of the applied RF actually measured on the electrode, has been shown to be about one fifth of the RF wavelength at the same frequency in free space. At 200 MHz, the free-space wavelength of 1.5 meters is reduced to an effective wavelength of about 0.3 meters, which is comparable to the dimension of a capacitive electrode or a 300 mm wafer. This can produce differences in voltage or current over the dimensions of a wafer, which can lead to spatial non-uniformities in plasma and plasma processing. Furthermore, the high frequency capacitive discharge can experience capacitive-to-inductive (E to H) transitions when the injected power, i.e. the voltage between the electrodes, is increased. When both the capacitive and inductive power are radially non-uniform, severe problems of process uniformity can result.

Simulations of the RF discharges driven at various frequencies have been published showing that plasma density, ion current and plasma power are proportional to the square of the RF frequency that is driving the discharge, for constant RF voltage. Electron density is also predicted to scale linearly with increased pressure. Charged and neutral particle density has been examined to look for possible effects due to a capacitive-to-inductive transition in the energy deposition mechanism, and to explore CCP operation above the frequencies of 27 and 60 MHz. Multiple frequency excitation was shown to lead to new electron heating mechanisms. The electron heating in the sheath has been shown to be greatly enhanced by the combination of two frequencies, producing heating that is much larger than the sum of the two single contributions. It was observed that the higher frequencies drive the larger density in the central area of a plasma column in CCP, shifting the spatial distribution from one that is uniform to one that is highly peaked in the center. When combinations of two or more frequencies are coupled into the chamber, even at lower than VHF frequencies, products can be produced that have an effective portion in the VHF range sufficient to influence the plasma.

Other approaches to improve non-uniformity in 300 mm systems and large area CCP sources have been described in publications, such as the suppressing of standing wave non-uniformity for large area rectangular CCP reactors. Electromagnetic effects also become important at high frequencies, for which significant heating is provided by the inductive field parallel to the electrode where the discharge experiences a capacitive-to-inductive transition when the high frequency voltage amplitude is raised. The electromagnetic effects of this lead to severe non-uniformity of the power deposition, which, in turn, can ruin process uniformity.

There is a need to solve the problems of increased causes of non-uniformities in the processing of large area substrates.

SUMMARY OF THE INVENTION

An objective of the present invention is to provide a plasma source for use in processing large area substrates. Another objective of the invention is to increase the uniformity of a plasma process in systems such as for plasma etching, plasma deposition and plasma cleaning.

A further objective of the invention is to eliminate or at least reduce non-uniformity effects that are particularly experienced in the plasma processing of large area substrates, for example, 300 millimeter (mm) and 450 mm semiconductor wafers.

More particular objectives of the invention include eliminating or reducing standing-wave effects and inductive edge-current effects in processing with CCP sources.

Yet another objective of the invention is to effectively generate plasma in processing by using an ICP technique.

A still further objective of the invention is to meet the above objectives without substantially increasing cost or technical complexity over that of current plasma processing systems.

According to principles of the present invention, an Embedded, Multiple-Inductive, Large-Area Source (EMILA) is provided for plasma processing. The source has multiple primary sources of plasma.

According to certain principles of the invention, an array of plasma generating cells, each a discrete plasma generating source, is disposed in a plasma processing chamber in communication with a plasma volume in which a large area substrate is supported for processing. The cells are spatially distributed in relation to the substrate so that plasma from each of the cells propagates into the processing volume at different, spaced-apart points, so that the density distribution of the plasma in relation to the substrate is more uniform than the distribution in the chamber would be were the plasma provided by a unitary, bulk plasma source.

In particular embodiments according to these principles, an array of three, four or more cells, arranged in a line, or an array in which cells are disposed in more than one dimension, are preferred. The disposition of the cells is such as to introduce plasma into a processing space from a plurality of points to provide a capability of favorably affecting plasma uniformity in the volume of the processing chamber or in the vicinity of a large area substrate supported in the chamber for processing.

In other embodiments, a plurality of cells that are spaced from each other and in communication with a processing volume of a chamber are differently controlled to supply plasma from different points to a processing volume of a chamber in a way that compensates for or otherwise varies the plasma from the different cells so as to achieve a desired effect on the distribution of the plasma in the chamber. Control of electrical power, RF frequency, gas flow rate or gas flow composition are examples of such different control.

According to other principles of the invention, plasma generating cells are provided having inductive elements configured to concentrate plasma power within the cells using a novel 3D modification of segmented antenna concepts to efficiently generate and inductively couple plasma into each cell. The cells can be used in combination with capacitive coupling to separately control plasma density and plasma potential. Differential control of different ones of such cells can be used to control plasma density distribution.

According to certain embodiments of the invention, radical or plasma cells, or micro-cells, are embedded within a plasma processing chamber, for example in the top of a CCP chamber electrode or in some other extended chamber component. The cell sources can be powered, for example, by very high frequency (VHF) energy, which is typically considered as being in the 30-300 MHz range. For example, cells can be powered in the 50-100 MHz or 100-200 MHz frequency ranges, generating inductively coupled plasma within each cell. A top chamber electrode for a CCP source can be also biased at a lower frequency. The substrates can be placed on a grounded or biased substrate support electrode. A large surface area plasma slab or in-line plasma source can, for example, be produced with this structure, by appropriate arrangement of the multiple primary cells.

The invention provides compensation for non-uniformity effects that are particularly experienced in the plasma processing of large area substrates. For example, compensation is provided for standing-wave effects and edge-inductive-coupling effects in CCP etchers, particularly in high frequency, dual frequency systems, and otherwise provides uniformly distributed gas or plasma for larger area substrate processing. Embodiments of the invention provide control of active species distribution within a processing chamber and separation of a primary plasma zone from a secondary processing zone.

The invention is particularly useful with higher frequencies having corresponding wavelengths that are comparable to the electrode or wafer size. In such cases, electromagnetic effects can vary over the extended geometries. Such effects can become important and are believed to provide a significant amount of heating in a CCP source by producing an inductive field that results as the discharge experiences a capacitive-to-inductive transition when the high frequency voltage amplitude is raised.

Embodiments of the invention can be formulated in several aspects of the plasma processing system, for example, in hybrid inductively and capacitively coupled plasma sources configured for localized high frequency ICP and global low frequency CCP, where they are useful for radial uniformity improvement in 300 mm-450 mm wafer etching and other large area plasma source processes. Embodiments of the invention are also useful in eliminating or reducing "standing wave" effects and "inductive edge" effects in CCP systems and other high frequency plasma sources. Embodiments of the invention can enhance dissociation of a working molecular gas. Embodiments can provide an ionization zone separate from a radical processing zone in a compact fashion.

The invention allows control parameters, such as independent high frequency power and low frequency power, with independent control of the generation rate and the energy of the ions in the plasma. Gas flow rate control and geometrical disposition of micro-cell sources can provide control of processing uniformity.

Embodiments of sources according to the invention have a hybrid but compact structure with inductive elements that are embedded into a main electrode of the capacitively coupled plasma (CCP) source and have geometries that produce inductively coupled plasma (ICP). The source can alternatively or in addition be embedded in other hardware parts within a processing chamber.

Advantages of the invention include a compact assembly embedded in a CCP electrode or elsewhere in a chamber. Dual frequency operation, with independent control of flux and the energy of species is provided, such as separate control of high frequency power and low frequency power. Localized ICP performance can provide increased plasma density and improved gas dissociation, along with a reduction of the "standing wave" effects and "inductive edge" effects in CCP in a high frequency plasma source. An ionization zone separate from a radical processing zone can also be achieved in a compact fashion.

In practicing the invention, commercial EM or modeling software is available and can be used to optimize device design in 3D space for specific processor configurations. Interference and control of neighboring micro-cells may be resolved by persons skilled in the field and in part may be learned by practice of the invention.

The invention is useful in large plasma sources and related technologies, including, for example, CCP plasma etch systems (dual frequency), activated neutral gas etch and deposition systems, PECVD or other CVD systems, plasma cleaning systems, surface and polymer modification plasma systems, and surface reaction systems.

These and other objectives and advantages of the present invention will be more readily apparent from the following detailed description, in which:

BRIEF DESCRIPTION OF THE DRAWINGS

FIGS. 3A-3E are illustrations of opening patterns of the cell of FIG. 2.

DETAILED DESCRIPTION

Certain aspects of the present invention can be understood by reference to the principles of the segmented antenna (SEGA) disclosed in applicant's commonly assigned US patent application, Pub. No. 2005/0103445, hereby expressly incorporated by reference herein. Certain embodiments of the SEGA utilize a conductor that has a variable cross-section, which creates low and high impedance portions of the inductive element that provide different current densities through the different portions of the conductor. This approach provides the ability to pre-design the inductive antenna to localize RF power distribution deposited into plasma by magnitude and geometrical configuration.

Figure 1A:
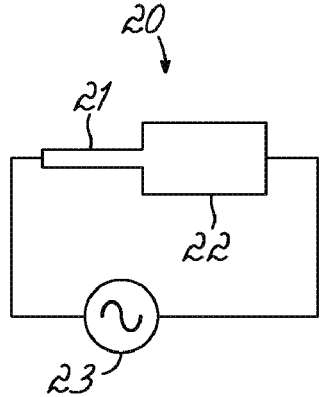
FIG. 1A is a circuit diagram of a planar segmented antenna of varying cross-section.
Figure 1B:
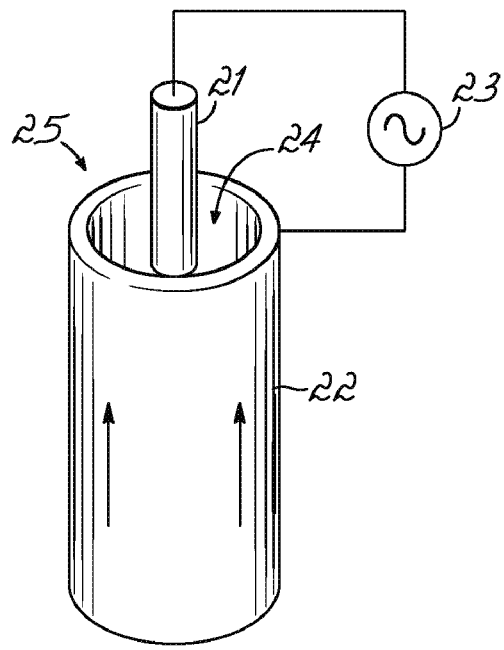
FIG. 1B is a diagram of a modification of the planar segmented antenna of FIG. 1A folded in a concentric 3D arrangement to form a microcell.

FIG. 1A is a circuit diagram illustrating a 2D-planar segmented antenna 20 having a narrow portion 21 of small cross-section connected in series with a wide portion 22 having a relatively large cross-section, or a plurality of alternating small and large cross-section portions connected in series, across an RF generator 23. The narrow portion 21 has a high inductance and concentrated current surrounded by strong magnetic fields near the conductor surface, while the wide portion 22 has a relatively low inductance and more distributed current surrounded by relatively weak and magnetic fields close to the conductor surface. By shaping the portions 21 and 22 of the antenna 20 as concentric cylinders to conduct a central outgoing inner current within a concentric return outer current, as illustrated in FIG. 1B, a cavity 24 is created within the conductor of the antenna 20, forming a micro-cell 25. Considering the much higher RF current density in an axial conductor 21, plasma will be created by intense concentric RF magnetic fields around the axial conductor. After passing through the axial portion 21 of the conductor of the antenna 20, the RF current follows a return current path through the large area cylindrical portion 22.

By application of RF power from generator 23 to the antenna 20 configured as in FIG. 1B, plasma will be produced within the cavity 24 of the micro-cell 25 under appropriate process conditions, for example, by applying RF power at an operating frequency of between approximately 50-100 MHz at an argon gas pressure of 20 to 100s of mTorr, although other frequencies and pressures may be appropriate for particular processes. A micro-cell 25 is illustrated in schematic cross-section in FIG. 2. The micro-cell 25 includes the central conductor 21 surrounded by the outer conductor 22, which can be formed by a metallic plate 50, defining the cavity 24 between the conductor portions 21 and 22. An insulator 26 is provided to separate the conductor portions 21 and 22 and support the outer conductive plate 22. A tapered or reduced cross-section axial conductor section 27 may be optionally provided to further concentrate the magnetic field in the zone where plasma is created. This provides additional enhancement of plasma production due to the increased current density flowing in the narrowed conductive section 27 of the conductor portion 21. This concept of power concentration can be referred to as "locally-enhanced inductive coupling" (LEIC).

Plasma formed in the micro-cell 25 propagates out of the cavity 24 through appropriate openings 28 that communicate with the process volume 30 of a processing chamber. The outlets 28 of the micro-cell 25 can have a variety of shapes and dimensions, some of which will be more appropriate than others, depending on overall chamber and process design. The outlets 28 should be selected to provide a transition from the axial conductor geometry to the cavity geometry. FIGS. 3A-E show several options for outlet openings 28. These outlets 28 can also have an impact on, and can be designed to adjust, the total inductance and load of the antenna 20. For example, viewed from the volume 30 on the chamber side, the configuration in FIG. 3A provides continuous conductive connections 29a between central conductor 21 and the outer cavity conductor 22 in the form of several radial spikes 31. In FIG. 3B, spikes 32, 33 are not continuous, but are separated by a gap 34 and are coupled capacitively. In FIG. 3C, two pairs 28a, 28b of ½ circular openings are provided. In FIG. 3D, spiral opening 28c, and in FIG. 3E, circular openings 28d and 28e are provided to define interconnects 29b and 29c, respectively, between conductor portions 21 and 22.

Figure 4:
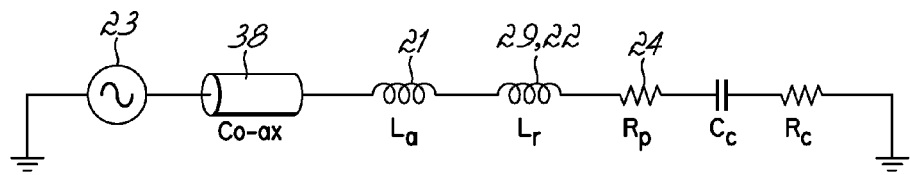
FIG. 4 is an equivalent circuit representation of the cell of FIG. 2.

The continuity of the plate 22 that forms the main electrode, or of such other structure that forms the surface that faces the process volume 30 of the chamber, should provide minimal pattern transfer into the bulk plasma or towards the wafer. The shapes of the openings 28 can affect this. The micro-cell sources 25 can be embedded into a one-piece main electrode, which can be a large cross-section conductor 22 for all of the cells. The micro-cell sources 25 can alternatively be individual single sources attached to a main body "electrode" or "holder". An equivalent circuit, for example, of such a configuration is shown in FIG. 4, in which a lead 38, which may include, for example, a coaxial cable or a suitable matching network, from the generator 23 to a micro-cell 25 is shown as feeding the axial inductance (La) of inner conductor 21, which connects to a radial (outlet) inductance (Lr) representing, for example, conductor portions 29 and 22, a plasma resistive load (Rp) in the chamber 24, a connection capacitance (Cc) which can be present from the conductors, and a micro-cell resistive load (Rc). This represents a serial resonant circuit with maximum current at a resonance frequency. Accordingly, the theoretical resonance in the RF magnetic fields will be a result of the total inductance Lc=La+Lr and connection capacitance (Cc).

Figure 5:
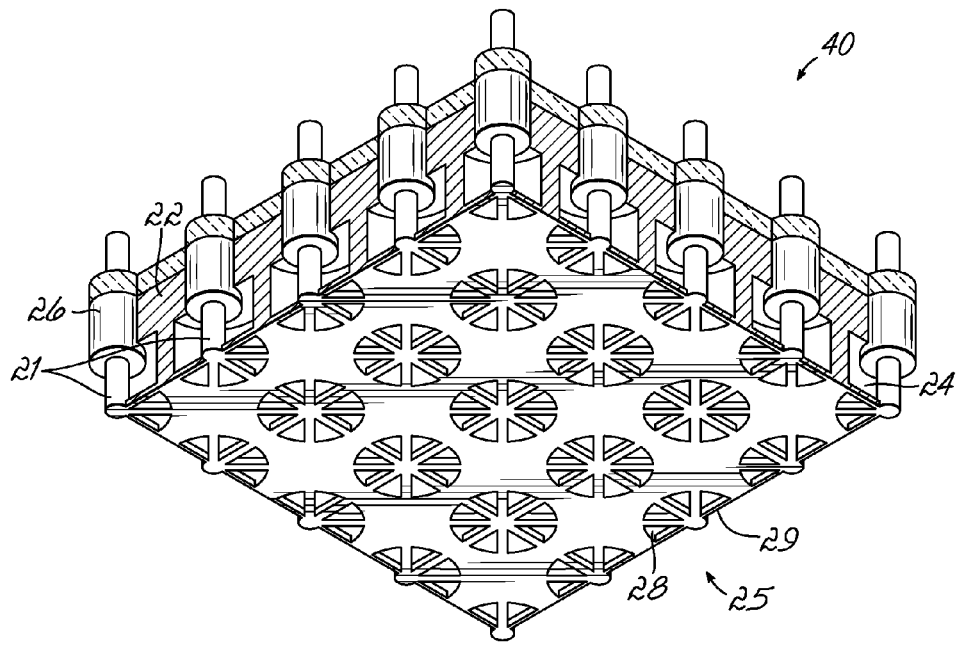
FIG. 5 is an isometric diagram of a section of an array of micro-cell plasma sources.
Figure 6:
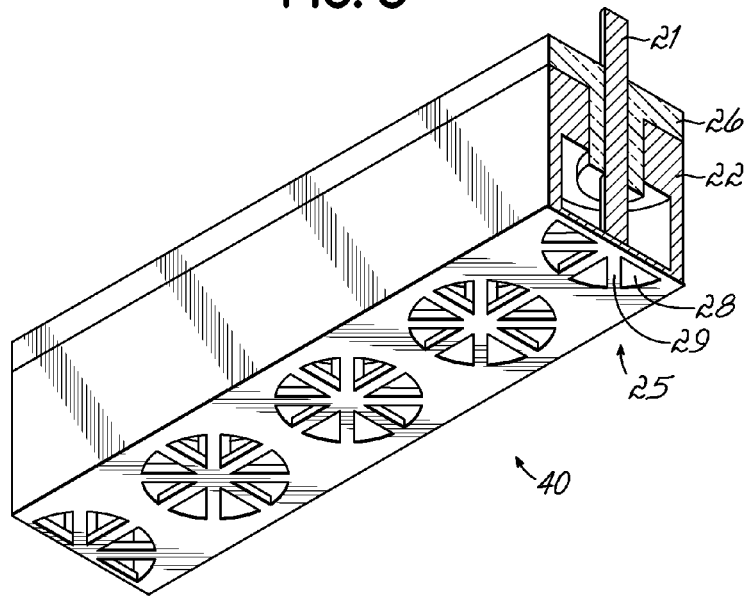
FIG. 6 is diagram similar to FIG. 5 illustrating an alternative embodiment of an alternative array of the micro-cell sources.

To provide uniform plasma, several micro-cells 25 can be embedded in a single large electrode 40, as illustrated in FIG. 5. The micro-cells 25 can be arranged also in one-line fashion, as it is shown in FIG. 6. These micro-cells are usually of the same geometry, but need not all have the same geometry. The cells of the same or different geometries may be energized differently. The differences can be selected to compensate for various non-uniformity effects to improve overall uniformity or otherwise shape the uniformity.

Figure 7:
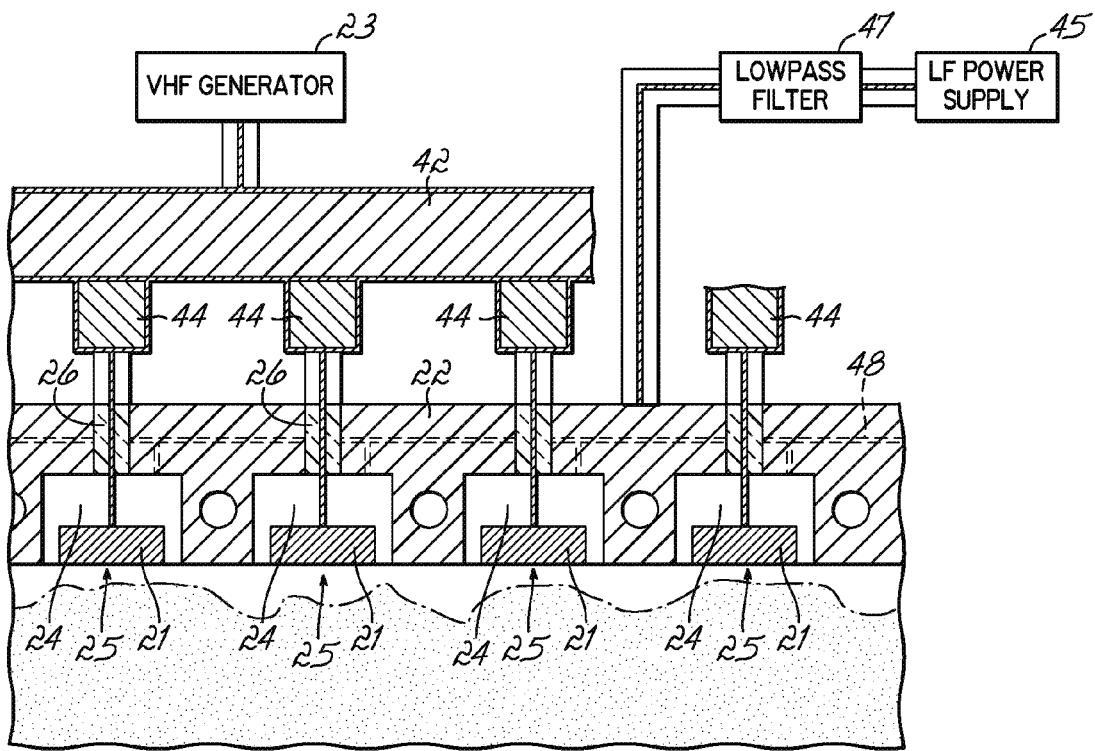
FIG. 7 is a representative cross-sectional diagram of the arrays of FIGS. 5 and 6.

The individual micro-cells 25 are preferably powered by a high frequency electromagnetic field from a 50 to 100 MHz supply 23, through the power splitter 42 configured to deliver an appropriate portion of the total RF power to each cell 25, as illustrated in FIG. 7. In each of the RF delivery lines for each cell 25, a high pass filter 44 is connected in series to prevent low frequency current from flowing into the high frequency supply 23. The electrode 22 can be powered by low frequency power from a LF power supply 45 that is connected to it through a low pass filter 47. With two generators 23 and 45, both plasma density and ion energy can be controlled independently, plasma density by HF (or VHF) and energy by LF or relatively lower frequency than the HF. The micro-cell plasma, however, will operate independently whether LF is applied or not. Process gas can be fed through gas distribution channels formed in the electrode plate 22, or through some other convenient structure.

Figure 2:
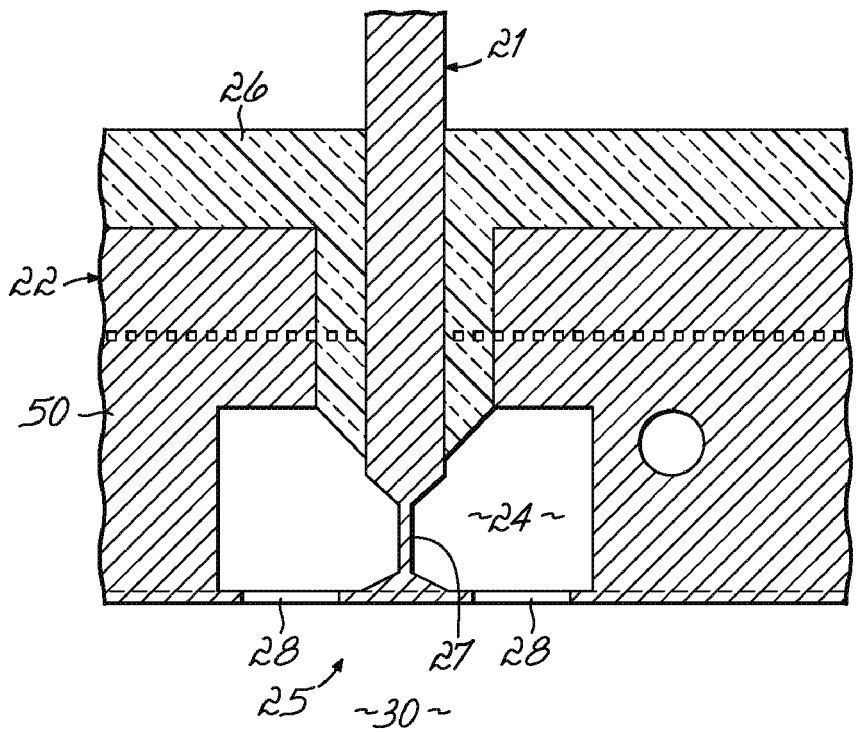
FIG. 2 is a cross-sectional diagram of an embodiment of the microcell of FIG. 1B.
Figure 8A:
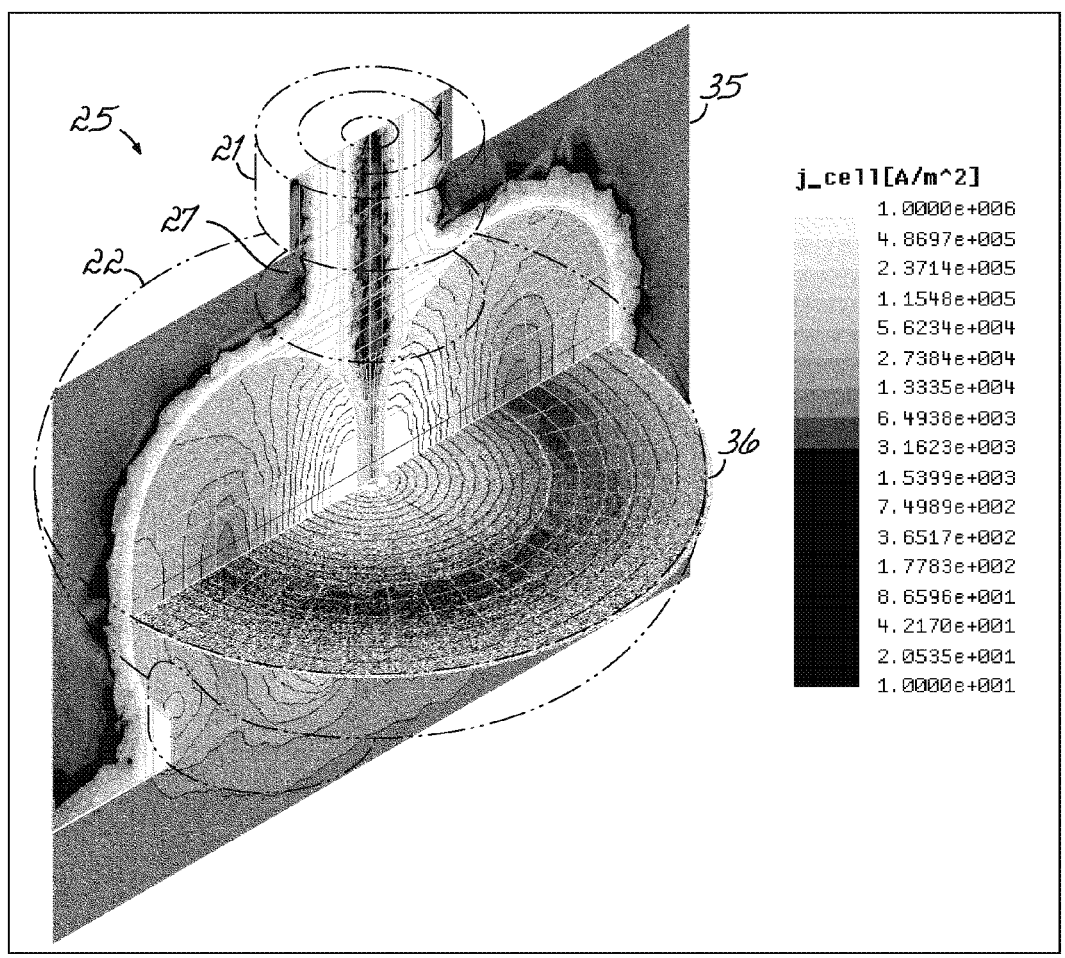
FIGS. 8A and 8B are 3D graphs of simulations of surface current density and current and B-field vectors, respectively.
Figure 8B:
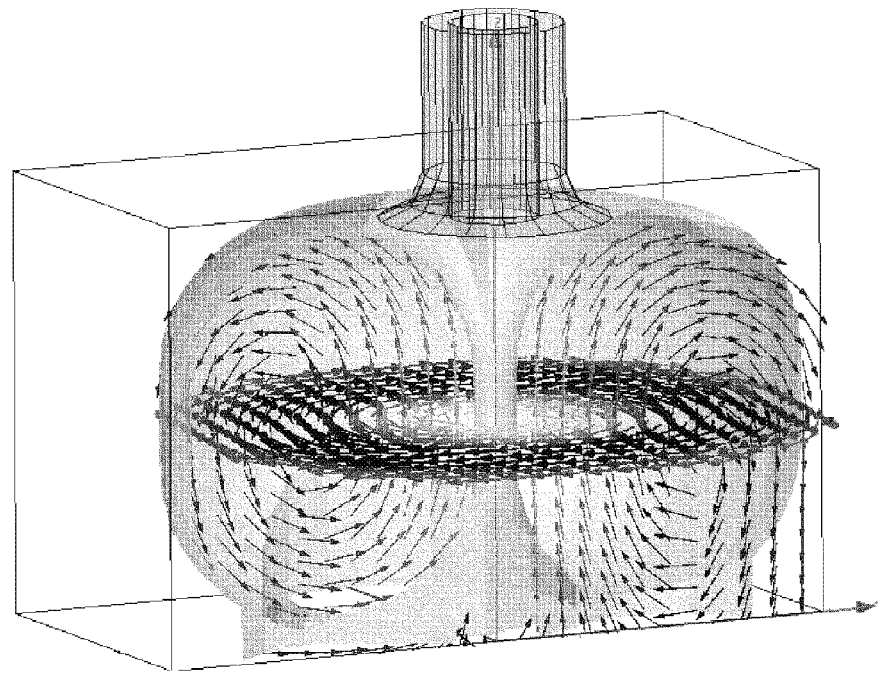

FIGS. 8A and 8B show simulation results of one micro-cell 25 with a spherical shape cavity and an enhanced axial RF power configuration of the type that would be produced by the axial conductor 21 of FIG. 2 which has the reduced axial conductor section 27. FIG. 8A shows surface currents on the surfaces of the axial conductor 21 and of the outer conductor 22 formed of the walls of cavity 24 in the block 50. The current density is the highest in narrow portion 27 of the axial conductor 21. The B-field magnitude is shown in crossing a horizontal plane 35 with its maximum localized closely to axial conductor 21. The induced HF plasma current magnitude is shown in a radial-axial plane 36. FIG. 8B shows the directions and magnitude of peak current density in the plasma within the cavity 24 of a cell 25.

Common or separate gas inlets can be connected to each local plasma micro cell 25 by a gas distribution system, which can be incorporated into the main electrode body 50. One or more gases can be used, and different gases can be introduced into different cells. This provides the advantage that each gas can be excited into a plasma state prior to mixing with other gases in the main chamber, or at-least at significantly reduced concentrations of other gas components. The EMILIA source provides the ability to control uniformity by different control of parameters in different cells 25, such as by varying HF power or gas flow rate to have a desired effect on the plasma downstream in the main chamber.

Figure 9:
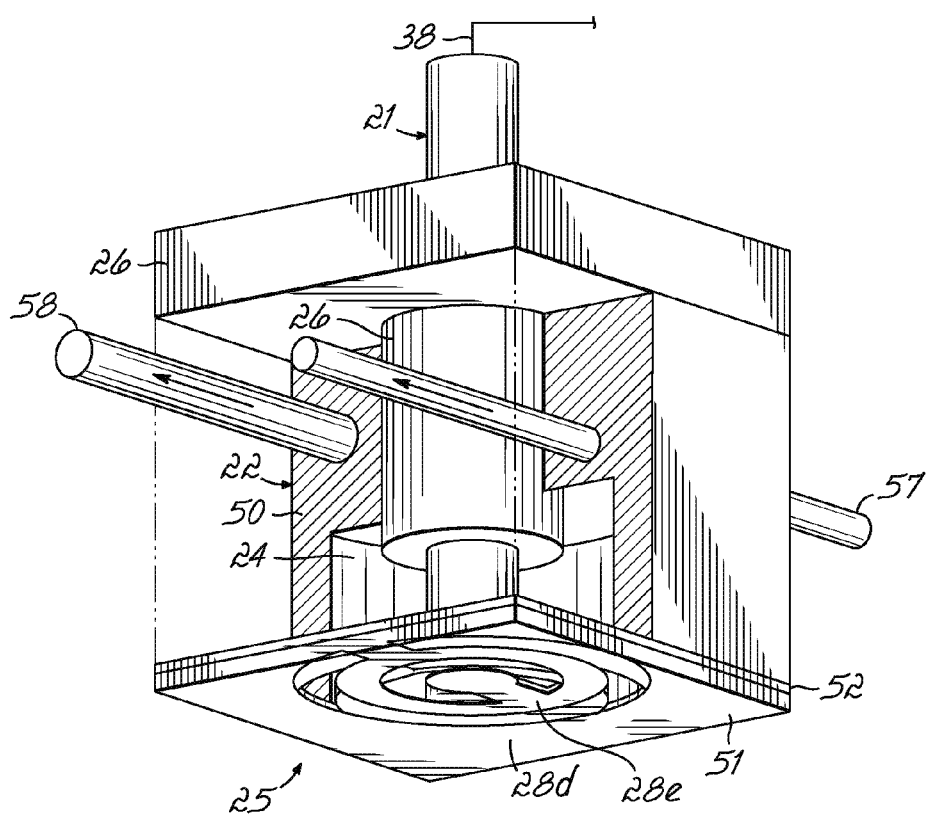
FIG. 9 is an isometric diagram of the microcell of FIG. 2.

FIG. 9 is a three-dimensional view of an axially-symmetric microcell 25, similar to that of FIG. 2, having an outlet opening 28 configured as the openings 28d and 28e of FIG. 3e. The single micro-cell 25 contains primary plasma volume within cavity 24 embedded in the main body formed of the plate 50, which is made of metal, for example aluminum or an aluminum alloy, having good surface conductivity. Alternatively, the plate 50 can be formed of an insulator material and coated with an electrically-conductive film. The openings 28d, 28e can be formed in an outlet plate 51 that is metallic and electrically connected to the inner conductor 21.

Figure 10:
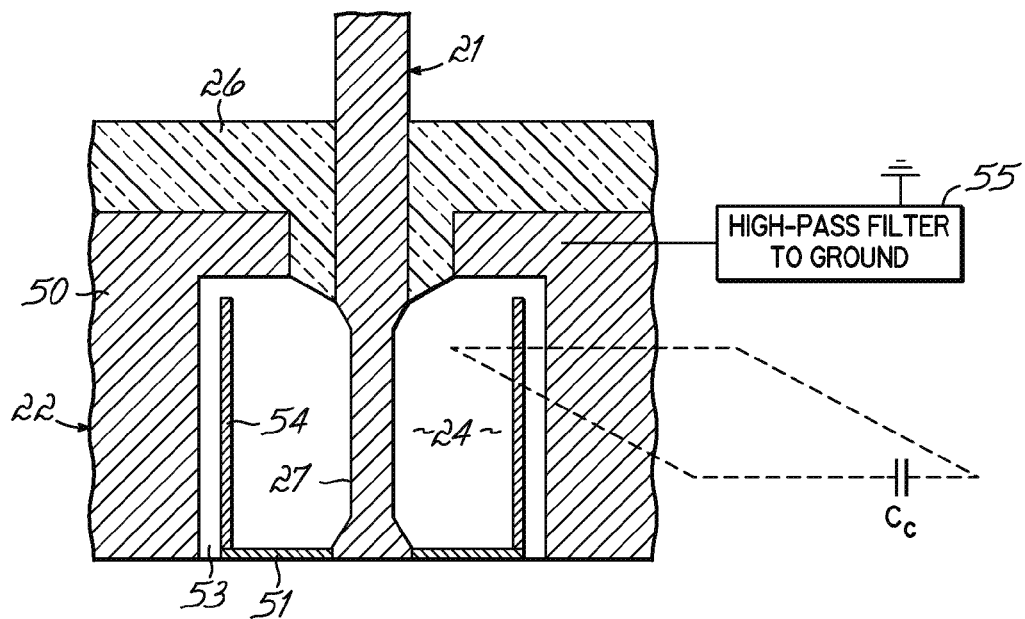
FIG. 10 is a cross-sectional diagram of an alternative embodiment of the microcell of FIG. 2.

The plate 51 is shown as isolated from the main body 50 by an insulating coating or insulator plate 52, which forms the connection capacitance (Cc) in FIG. 4 between the plate outlet 51 and the main body 50. Inclusion of the connection capacitance (Cc) can be provided in another way, for example, as shown FIG. 10, as a gap 53 between the surface of the cavity in main electrode body 50 and the outlet plate 51, such as can be formed by a cylindrical flange 54 extending from the output plate 51. This capacitively connects the inductive element 21 to the main electrode body 50. Main electrode body 50 is well grounded at high frequency through a high pass filter 55 to ground, which also maintains a good connection with the ground of the lead 38 (FIG. 9) that supplies HF input to the inner conductor 21. In FIG. 9, the conductor 21 that forms the axial inductive element is insulated from the main electrode body 50 by insulation 26. Within the main electrode body 50, distribution channels 57 and 58 for operating gas and cooling medium, respectively, are incorporated.

Figure 11:
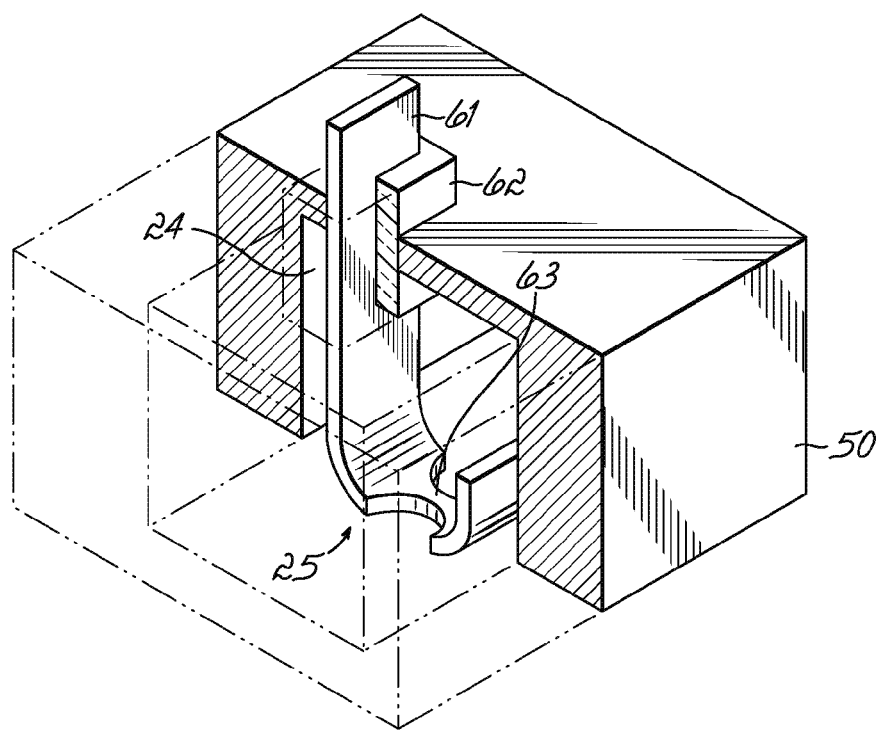
FIG. 11 is an isometric diagram similar to FIG. 9 illustrating a cell having a J-antenna configuration.
Figure 12:
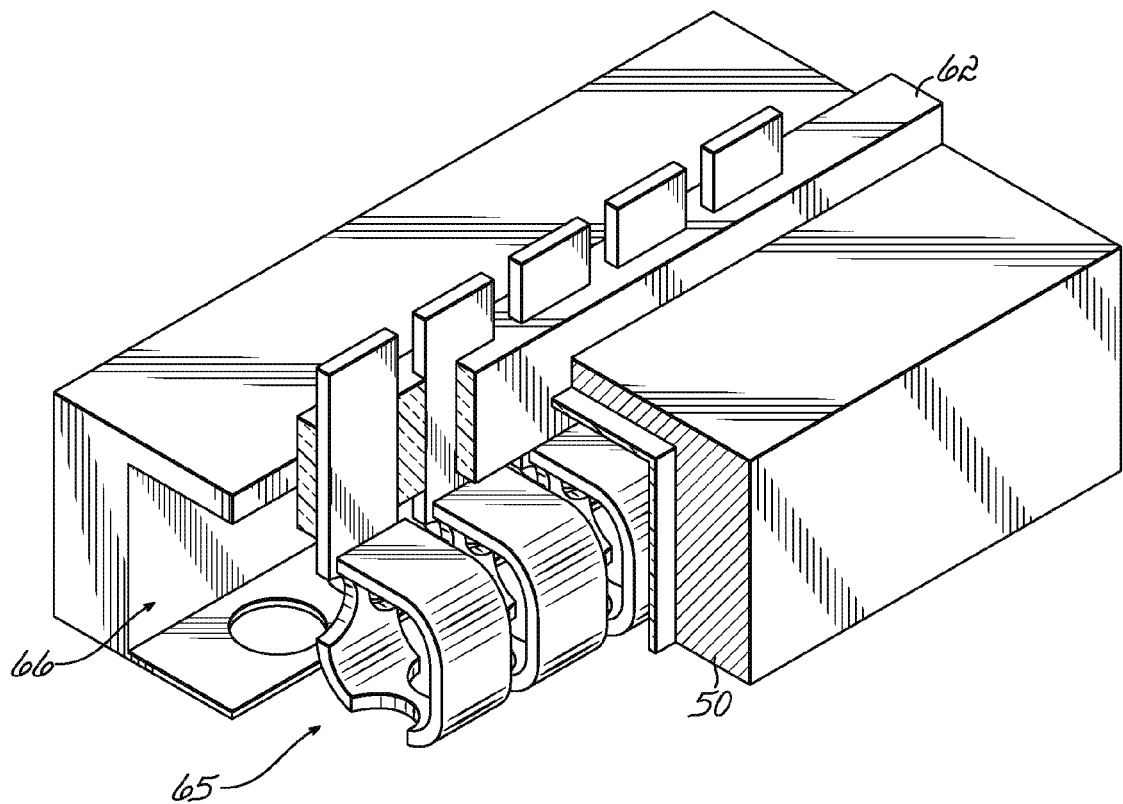
FIG. 12 is an isometric assembly similar to FIG. 6 showing cells having an alternative antenna configuration.

An alternative inductive element 21 is shown in FIG. 11 in a shape of the J-antenna 61. The connection capacitance (Cc) in series can be provided by including an insulating layer 62 between J-antenna 61 and the surface of the micro-cell cavity wall formed of the main body 50. The cavity 24 can have a rectangular cross section, as shown. Other cross-sectional shapes can be used, of which circular, oval, elliptical, or various polygonal shapes are examples. The shape can be selected to optimize plasma generation inside micro-cell 25. Enhanced radiation for the J-antenna 61 can be provided by incorporating a reduced cross-section portion 63, for example the semicircular cutout portion 63 of the J-antenna 61. Other shapes for the inductive element 21 can be used. For example, multiple part inductive elements 65 can be assembled, for example, in a cavity having a linear configuration, such as is shown in FIG. 12. Here, several J-antennas are assembled into a single conductor in linear cavity 66.

Figure 13A:
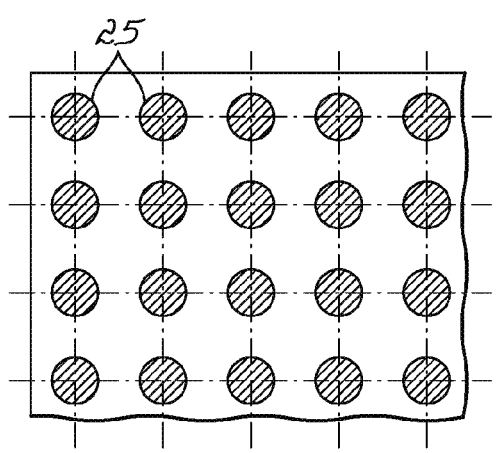
FIGS. 13A-E are diagrams showing various plasma source cell arrays.

As is shown in FIG. 5, a plurality of individual cells 25 can be arranged into matrix or array, producing large area electrode 40 for use as a large area plasma source. Several arrays of multi-cell source configurations are presented in FIGS. 13a-13e, which shows rectangular grids (FIGS. 13A and 13B), hexagonal arrangements (FIG. 13C), linear arrangements (FIG. 13D) and circular, arcuate or polygonal arrangements (FIG. 13E), for example.

Figure 13B:
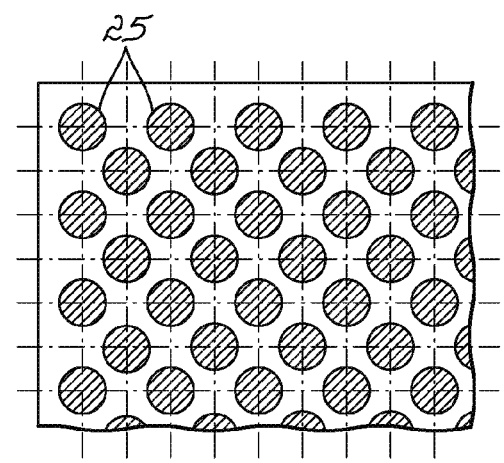
Figure 13C:
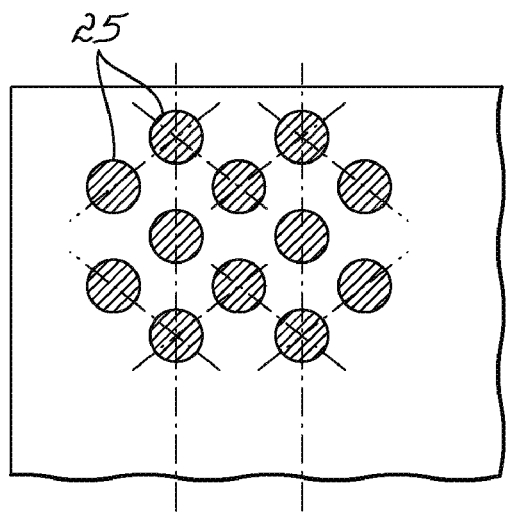
Figure 13D:
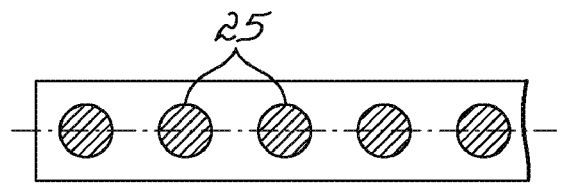
Figure 13E:
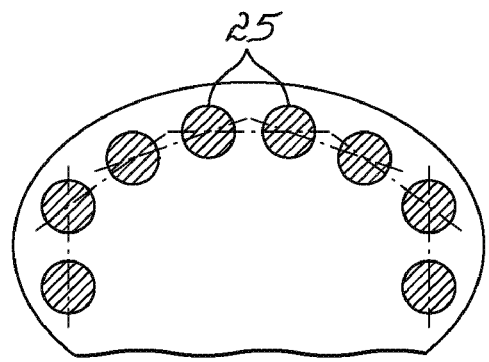
Figure 14:
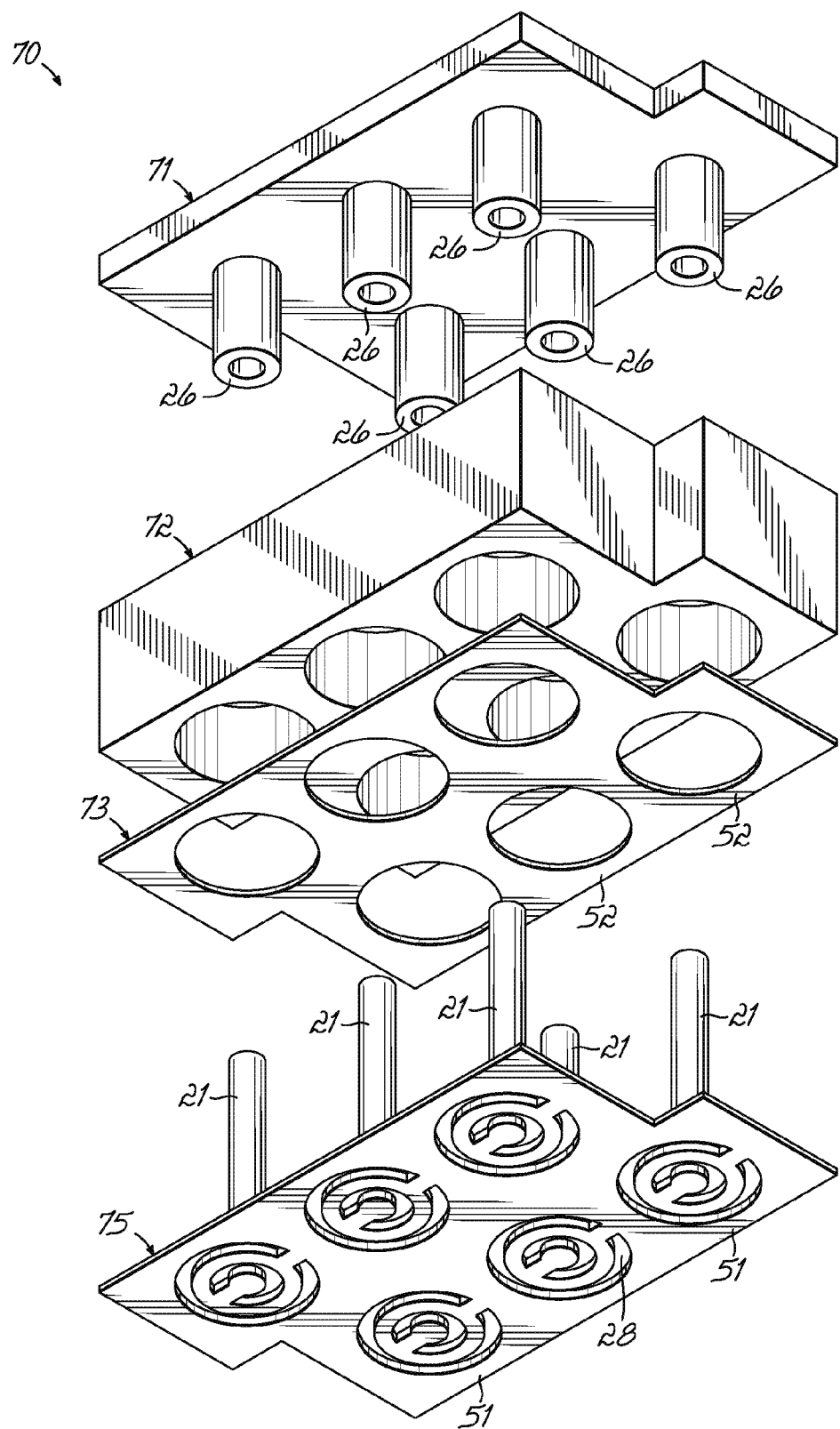
FIG. 14 is a disassembled isometric diagram of a plasma source microcell array.

FIG. 14 illustrates an example of a simplified assembly 70 of a section of a plasma source formed of an array of microcells 25 in the pattern of FIG. 13B. The assembly 70 can be made of a limited number of parts that each form common components for a plurality of the microcells that are shown in detail in FIG. 9. For example, an insulation layer 71 can form the insulators 26 of a plurality of cells 25 of the array 70. A common block 72 can form a plurality of the main bodies 50 of the cells 25. A single insulator sheet 73 can form the insulators 52. A single piece of conductive metal 75 can form an assembly of multiple outlet plates 51 and corresponding axial conductors 21 of plural microcells 25 of the array. Vacuum sealing can be done by methods known in the art. In the simplest case, sealing O-rings can be used.

The frequency range of the RF power is preferably approximately from 50 MHz to 100 MHz, but the possible frequencies are not limited by this range. Frequency much higher, up to 500 MHz for example, and in special cases up to 1 GHz, can be utilized. The high frequency RF power is supplied through the power splitter 42 to deliver a portion of the HF power to each cell, as described in FIG. 7, where high pass filters 44 are shown connected in series in the delivery lines for each cell 25 to prevent low frequency current from flowing into high frequency supply 23. Also main body electrode 50 is grounded through the high-pass filter, and ideally to the ground of the lead 38 (FIG. 4). The main electrode 50 is powered by low frequency power from LF power supply 45 in series with the low pass filter 47 so that both plasma density and ion energy can be controlled independently: plasma density by HF and energy by LF. With this method, the microcells 25 will operate with no LF power connected.

The optimal tapered shape of the axial conductor 21 can be determined by EM simulation and by experimentation to adjust the optimal plasma load inside micro-cells. Radial or outlet inductance can also be varied to tune the total inductance of the source. The various outlet openings 28 shown in FIG. 3 can be changed to vary the total inductance of the load.

Depending on dimensions of the cell cavities 24 and the exciting frequency, the operating pressure will range from tens of mTorr to hundreds mTorr. Very high frequency operation is suitable for a pressure range of from several Torr to sub atmospheric pressure. It is likely that even atmospheric operation at 1 GHz or above may be achieved.

Common or separate gas inlets can be used for the different micocells. A gas distribution system can be incorporated into the block 72 of which the main electrode bodies 50 are formed. One or more gases can be used, and different gases can be supplied to different microcells 25, which will allow each gas to be excited into a plasma state without mixing with another gas, or at-least mixing at a significantly reduced concentration, and interacting in the main reaction chamber.

The EMILA source described above provides control of uniformity by the design, HF power control, and flow rate control to control plasma downstream using individual local micro-cell plasma sources. In some embodiments, an array of plasma generating microcells 25, even of identically configured and controlled cells, properly distributed adjacent a processing chamber, can produce a plasma of greater uniformity over a large area substrate of 300 mm or larger than would be produced by a unitary RF plasma source, or one that uses one or more large coupling elements, to produce a bulk plasma in the processing chamber. In other embodiments, control of electrical and gas parameters among different cells of a plural cell array can be employed to enhance or otherwise favorably affect the uniformity of the plasma.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A plasma source for a plasma processing apparatus for use in a plasma processing apparatus having a processing chamber that encloses a plasma processing volume, the source comprising:

an RF generator;

a chamber component configured to mount in the processing chamber of the plasma processing apparatus, the chamber component having a surface thereof facing the plasma processing volume and having a plurality of openings therein;

a plurality of cells embedded in the chamber component, each cell containing a cell volume communicating through a different one of the openings in said surface of the chamber component with the plasma processing volume;

the openings in said surface of the chamber component being arranged in an array so that primary plasma formed in the cell volumes will be introduced through the openings from the cell volumes into the plasma processing volume at a plurality of spaced apart locations; and each cell having an antenna coupled to the RF generator and inductively coupled to the cell volume thereof, the antennas being configured to form a primary inductively coupled plasma in the cell volume of each respective cell when energized with RF energy from the RF generator;

the chamber component being an electrode having an electrode body with said surface thereon configured and arranged to capacitively couple energy to plasma in the plasma processing volume;

the cells being embedded in the electrode body with the cell volumes forming cavities in the main electrode body and the openings communicate between the cavities and the plasma processing volume through said surface;

the antennas each forming an RF series circuit with the RF generator and the electrode body, the cells each having geometries that produce primary inductively coupled plasma in the cell volumes to propagate through the openings into the plasma processing volume; and each cell comprising:

an electrically-conductive outer wall enclosing the cell volume of the respective cell and having an end capacitively coupled to said surface of the electrode; and an axial conductor in the cell volume capacitively coupled to said outer wall at said surface at said end of the outer wall, the conductor being inductively coupled to the cell volume, the outer wall forming a return path from said end parallel to the axial conductor.

2. A plasma processing apparatus comprising the plasma source of claim 1 and further comprising:
the processing chamber having therein the plasma processing volume and a substrate support configured to hold therein for processing a substrate having a dimension of at least 300 mm;
the RF generator being configured to introduce into the chamber RF energy that includes RF energy in the VHF range;
each cell volume being in vacuum communication with the plasma processing volume of the processing chamber; and
the cells being arranged in an array disposed in the plasma processing chamber with the cells spatially distributed in relation to the substrate support so that plasma from the cell volume of each of the cells propagates into the plasma processing volume of the processing chamber at different, spaced-apart points.

3. The plasma processing apparatus of claim 2 wherein:
the electrode is a CCP electrode in the chamber having the plurality of cavities therein.

4. The plasma processing apparatus of claim 3 wherein the RF generator is configured:
to power the antennas of each of the cells with VHF energy to cause the cells to form a primary inductively coupled plasma within each respective cell; and
to power the CCP electrode at a frequency lower than the energy powering the antennas to bias a substrate on the substrate support.

5. The plasma processing apparatus of claim 2 wherein the array includes a plurality of staggered rows of the cells.

6. The plasma source of claim 1 comprising at least three cells arranged in a linear array and communicating with the processing volume through openings in the chamber component that face in the same direction toward the plasma processing volume.

7. The plasma source of claim 1 comprising at least three cells arranged in a two dimensional array and communicating with the processing volume through openings in said surface of the chamber component that face the plasma processing volume.

8. The plasma source of claim 1 wherein:
the chamber component is an electrode having said surface configured to bound the plasma processing volume; and
the cells are embedded in the electrode and arranged in the array.

9. The plasma source of claim 1 further comprising:
a controller operable to control the RF generator to differently couple RF energy to each of the antennas of each of the cells to differently introduce plasma at the different spaced-apart locations to the plasma processing volume.

10. The plasma source of claim 1 wherein each cell includes:
an electrically-conductive outer wall enclosing the cell volume; and
an axial conductor forming the antenna and connected in an RF series circuit with the RF generator and the electrically-conductive outer wall.

11. A plasma source for a plasma processing apparatus for use in a plasma processing apparatus having a processing chamber that encloses a plasma processing volume, the source comprising:
an RF generator;
a chamber component configured to mount in the processing chamber of the plasma processing apparatus, the chamber component having a surface thereof facing the plasma processing volume and having a plurality of openings therein;
a plurality of cells embedded in the chamber component, each cell containing a cell volume communicating through a different one of the openings in said surface of the chamber component with a plasma processing volume;
the openings in said surface of the chamber component being arranged in an array so that primary plasma formed in the cell volumes will be introduced through the openings from the cell volumes into the plasma processing volume at a plurality of spaced apart locations; and
each cell having an antenna coupled to the RF generator and inductively coupled to the cell volume thereof, the antennas being configured to form a primary inductively coupled plasma in the cell volume of each respective cell when energized with RF energy from the RF generator; and
each cell comprising:
an electrically-conductive outer wall enclosing the cell volume of the respective cell and having an end capacitively coupled to said surface of the chamber component; and
an axial conductor in the cell volume capacitively coupled to said outer wall at said surface at said end of the outer wall, the conductor being inductively coupled to the cell volume, the outer wall forming a return path from said end parallel to the axial conductor.

12. The plasma source of claim 11, further comprising:
a common electrically conductive body with a plurality of cavities therein, each forming the cell volume of one of the cells with the body forming outer walls surrounding the cell volumes of each of the cells;
the body having electrically conductive surfaces at the outer walls of each of the cells; and
the RF generator having a first output coupled to the body to supply RF energy for capacitive coupling from the electrically conductive surfaces into the plasma processing volume, and having a second output coupled to the axial conductors to supply RF energy for inductive coupling from the axial conductors into each of the cell volumes for producing plasma therein to propagate through the openings into the plasma processing volume.

13. A plasma processing apparatus having the plasma source of claim 12 and further comprising:
a controller configured to separately control the inductive and capacitive coupling of energy from the respective outputs to separately control plasma density and plasma potential.

14. A plasma processing apparatus having the plasma source of claim 12 and further comprising:
the plasma processing chamber; and
a controller configured to separately control the coupling of energy to each of the axial conductors of a plurality of cells to concentrate plasma power within each of the cells in a way that compensates for or otherwise varies the plasma from the different cells to achieve a desired effect on the distribution of the plasma in the chamber.

15. The plasma processing apparatus of claim 14 wherein:
the controller is configured to separately and differently control the production of plasma among the cells by separate control of either electrical power, RF frequency, gas flow rate or gas flow composition to each of the cells.

16. The plasma processing apparatus of claim 14 wherein:
the controller is configured to separately and differently control the production of plasma among the cells to control plasma density distribution in the processing chamber.

17. The plasma source of claim 11 comprising at least three cells arranged in a linear array and communicating with the processing volume through openings in the chamber component that face in the same direction toward the plasma processing volume.

18. The plasma source of claim 11 comprising at least three cells arranged in a two dimensional array and communicating with the processing volume through openings in said surface of the chamber component that face the plasma processing volume.

19. The plasma source of claim 11 wherein:
the chamber component is an electrode having said surface configured to bound the plasma processing volume; and
the cells are embedded in the electrode and arranged in the array.

20. The plasma source of claim 11 further comprising:
a controller operable to control the RF generator to differently couple RF energy to each of the antennas of each of the cells to differently introduce plasma at the different spaced-apart locations to the plasma processing volume.

21. A plasma source for a plasma processing apparatus for use in a plasma processing apparatus having a processing chamber that encloses a plasma processing volume, the source comprising:
an RF generator;
a chamber component configured to mount in the processing chamber of the plasma processing apparatus, the chamber component having a surface thereof facing the plasma processing volume and having a plurality of openings therein;
a plurality of cells embedded in the chamber component, each cell containing a cell volume communicating through a different one of the openings in said surface of the chamber component with a plasma processing volume;
the openings in said surface of the chamber component being arranged in an array so that primary plasma formed in the cell volumes will be introduced through the openings from the cell volumes into the plasma processing volume at a plurality of spaced apart locations; and
each cell having an antenna coupled to the RF generator and inductively coupled to the cell volume thereof, the antennas being configured to form a primary inductively coupled plasma in the cell volume of each respective cell when energized with RF energy from the RF generator; and
each cell comprising:
an electrically-conductive outer wall enclosing the cell volume of the respective cell and having an end capacitively coupled to said surface of the chamber component; and
an axial conductor in the cell volume capacitively coupled to said outer wall at said surface at said end of the outer wall, the conductor being inductively coupled to the cell volume, the outer wall forming a return path from said end parallel to the axial conductor; and
each of the plurality of cells having common parts, including:
a block of material having the outer walls of the cells formed therein;
an electrically conductive metal sheet interconnecting said ends of the conductors of each of the cells; and
an insulation layer disposed between the electrically conductive metal sheet and the block of material.

22. The plasma source of claim 21, wherein the end of the conductor is connected to the sheet through one or more concentric conductor rings formed in the sheet.

23. The plasma source of claim 22, wherein the cells each further comprise:
an insulator between the axial conductor and the cell wall and a tapered or reduced cross-section portion of the axial conductor between the insulator and said end of the conductor.

24. The plasma source of claim 21, wherein the cells each further comprise:
an insulator between the axial conductor and the cell wall.

25. The plasma source of claim 21, wherein the cells each further comprise:
a tapered or reduced cross-section portion of the axial conductor between the insulator and said end of the conductor.

26. The plasma source of claim 21, further comprising:
a common electrically conductive body with a plurality of cavities therein, each forming the cell volume of one of the cells with the body forming outer walls surrounding the cell volumes of each of the cells;
the body having electrically conductive surfaces at the outer walls of each of the cells; and
the RF generator having a first output coupled to the body to supply RF energy for capacitive coupling from the electrically conductive surfaces into the plasma processing volume, and having a second output coupled to the axial conductors to supply RF energy for inductive coupling from the axial conductors into each of the cell volumes for producing plasma therein to propagate through the openings into the plasma processing volume.

27. A plasma processing apparatus comprising the plasma source of claim 26 and further comprising:
the plasma processing chamber; and
a controller configured to separately control the coupling of energy to each of the axial conductors of a plurality of cells to concentrate plasma power within each of the cells in a way that compensates for or otherwise varies the plasma from the different cells to achieve a desired effect on the distribution of the plasma in the chamber.

28. The plasma processing apparatus of claim 27 wherein:
the controller is configured to separately and differently control the production of plasma among the cells by separate control of either electrical power, RF frequency, gas flow rate or gas flow composition to each of the cells.

29. The plasma processing apparatus of claim 27 wherein:
the controller is configured to separately and differently control the production of plasma among the cells to control plasma density distribution in the processing chamber.

30. The plasma processing apparatus of claim 27 wherein:
the body is connected through a high pass filter to ground.

* * * * *